United States Patent [19]

Glatzle

[11] Patent Number: 4,704,249

[45] Date of Patent: Nov. 3, 1987

[54] PROCESS FOR PRODUCING A SUPERCONDUCTING WIRE HAVING A CHEVREL PHASES

[75] Inventor: Wolfgang Glatzle, Reutte, Austria

[73] Assignee: Schwarzkopf Development Corporation, New York, N.Y.

[21] Appl. No.: 797,494

[22] Filed: Nov. 13, 1985

[30] Foreign Application Priority Data

Nov. 14, 1984 [AT] Austria .................................. 3593/84

[51] Int. Cl.$^4$ ............................ B22F 7/04; B22F 3/24; B32B 15/02; H01L 39/24
[52] U.S. Cl. .......................................... 419/4; 428/556; 428/558; 419/8; 419/48; 419/28; 174/128 S; 29/599
[58] Field of Search ............... 428/556, 558, 562, 621, 428/628, 930; 420/901; 29/599; 174/15 S, 126 S, 128 S; 335/216; 148/11.5 F; 419/4, 8, 28, 48

[56] References Cited

U.S. PATENT DOCUMENTS

| | | | |
|---|---|---|---|
| 3,767,842 | 10/1973 | Bronca et al. .................... | 174/128 S |
| 4,127,700 | 11/1978 | Stockel et al. ...................... | 428/558 |
| 4,411,959 | 10/1983 | Braginski et al. .................... | 428/558 |
| 4,531,982 | 7/1985 | Dubots ............................. | 148/11.5 F |
| 4,543,449 | 9/1985 | Kuroda ............................. | 174/126 S |
| 4,594,218 | 6/1986 | Dubots et al. ........................ | 419/4 |

FOREIGN PATENT DOCUMENTS 2511202  2/1983  France ............................. 174/126 S

OTHER PUBLICATIONS

B. Seeber et al., "Investigation of the Properties of PbMo$_6$S$_8$ Powder Processed Wires"—IEEE Transactions on Magnetics, vol. Mag-19, No. 3, May 1983.
B. Seeber et al., "Powder Processed PbMo$_6$S$_8$ Superconducting Wires for High Magnetic Field Application"—Seminar, Reutte, Metallwerk Plansee, pp. 531-538.
B. Seeber et al., "PbMo$_6$S$_8$: A New Generation of Superconducting Wires?"—Published 1981 by Elsevier North Holland, Inc. Shenoy, Dunlap, Fradin, eds. Ternary Superconductors.

*Primary Examiner*—John F. Terapane
*Assistant Examiner*—Eric Jorgensen
*Attorney, Agent, or Firm*—Morgan & Finnegan

[57] ABSTRACT

The invention relates to a process for producing a superconducting wire, using, e.g., Chevrel phases as superconductors, in particular PbMo$_6$S$_8$. Until now, it was not possible to produce superconducting wires from such materials in a technically usable quality. According to the process of the invention, the superconducting Chevrel phase is loaded vacuum-tight into a molybdenum shell and the unit is advantageously sealed in another jacket made of steel. The powdery superconducting phase has an average grain size of less than 1 $\mu$m. For shaping the superconducting wire, the unit is extruded in a first process step at temperatures between 1000° and 1600° C. and reduced in cross section in excess of 1:10, and subsequently further treated in a plurality of process steps by additional extruding and/or hot drawing. Superconducting wires produced as specified above exhibit values for the critical quantities such as current bearing capacity, critical current density and limit values of the magnetic field that conform to those of the technically sophisticated superconductors of type II, or surpass the values of the latter type in individual instances. At the same time, it was possible to wind such wires to form coils without impairing the superconducting values due to the brittleness of the Chevrel phases.

8 Claims, No Drawings

PROCESS FOR PRODUCING A SUPERCONDUCTING WIRE HAVING A CHEVREL PHASES

BACKGROUND OF THE INVENTION

The invention relates to a process for producing a single-core or multi-core superconducting wire with application of a metal molybdenum chalcogenide (Chevrel-phase) in the superconducting phase, particularly by $PbMo_6S_8$, whereby the superconducting phase or the initial components for forming such a phase is/are placed vacuum tight in a molybdenum shell and said shell is advantageously placed in a steel jacket and whereby said unit is subsequently processed by hot shaping to produce a superconducting wire.

The development of superconducting wires and cables using binary compounds (type II superconductors), in particular $Nb_3Sn$ and NbTi, has made rapid advances in the course of the last few years. The technology of manufacturing single- and multi-filament conductors from superconducting and normally conducting materials arranged spatially next to each other has been constantly improved. The process steps of hot and cold shaping, e.g. extruding and wire drawing, play a significant role in the manufacture of multi filament conductors (German Pat. DE-AS No. 25 16 745; German Pat. DE AS No. 19 45 640). The developments in this field of technology have met upper limits as to three critical superconducting quantities, i.e., temperature, current density and magnetic field, which have not been raised to any appreciable extent.

It has been suggested to raise the limits of at least one of the critical superconducting quantities by changing from binary to ternary superconductive phases. The change to ternary systems, for example in the form of Chevrel phases (metal-Mo-chalcogenides) offers additional possibilities for varying metallurgical parameters important to superconductivity. However, processing problems in connection with ternary systems are becoming more extensive.

Accordingly, the few publications dealing with the feasibility of manufacturing superconductors with the application of Chevrel phases do not offer very much encouragement. In the report "Research Opportunities in Superconductivity"—published at a seminar held on Aug. 22 and 23, 1983 in Copper Mountain, CO., U.S.A., the following was stated on page 16: "Many new materials, e.g. $PbMo_6S_8$, cannot be produced by application of the extrusion and wire drawing technologies, which were so successfully used with Nb-Ti and $Nb_3Sn$." And in an article dealing with the Chevrel phases as new groups of high field superconductors, which was published in the trade journal "Metall", 35th Year, No, 4, April 1981, the following was stated on page 289, column 3: "Unfortunately, the manufacture of wires of ternary molybdenum-chalcogenides with a current bearing capacity that would be of interest technologically has not yet been achieved because of their poor metallurgical properties."

The problems encountered in the processing of Chevrel phases to superconducting cables, and in particular with $PbMo_6S_8$ are manifest. The metallic material $PbMo_6S_8$ is highly brittle. For this reason, it appears as a powdery heterogeneous phase. In addition to its low ductility, the Chevrel phases exhibit high sensitivity to oxygen and nitrogen, and also to other metallic elements, in particular Fe, Co, Ni and Cr. This means that the Chevrel phases have to be protected in the manufacture of superconducting wires and cables, against both direct contamination from these metals and the interdiffusion of metals through the sheathing materials at the high processing temperatures required. Like all superconductors, the Chevrel phases in superconducting wires and cables have to withstand mechanical stresses, i.e., they have to maintain the material densities achieved by means of suitable manufacturing procedures even when the conductor is flexed to form coils and when extreme tensile forces and pressures occur due to the high magnetic forces in a superconducting coil. Furthermore, superconducting wires produced with the application of Chevrel phases must be "stabilized cryogenically", i.e., the superconducting phase has to be in good thermal and electrical contact with a sufficient quantity of highly conductive, normally conducting metal which, in the event of a local breakdown of superconductivity, is capable of temporarily conducting the current, and which eliminates Joulean dissipation by transferring it to the helium cooling medium without the occurrence of any inadmissible rise in the temperature of the conductor ("Metall", 35th Year, No. 4, page 292).

Some isolated attempts have been made to manufacture superconducting wires having a Chevrel phase. For example, in a manufacturing test, the superconducting material $PbMo_6S_8$ or suitable initial components thereof were loaded vacuum-tight in a molybdenum or tantalum tube. This molybdenum or tantalum tube was subsequently sealed by welding in a tube made of stainless steel in order to protect the inner tube against oxidation during further processing. Further processing was carried out in two steps by hot drawing at 750° C. and 600° C., respectively, with intermediate annealing at 850° C. However, the result was not satisfactory. Critical current densities and magnetic fields were not achieved. It was assumed that the reason for this unsatisfactory result was that processing by high-temperature drawing caused the molybdenum tubes to become brittle and crack and that iron, chromium and/or nickel from the steel jacket diffused into the Chevrel phase through these cracks, which led to a destruction of the Chevrel phase (Seeber, B.; Rossel, C.; Fischer, O.: "Proc. of the International Conference on Ternary Superconductors", Lake Geneva, Wisconsin, USA, 1980; Seeber, B.; Rossel, C.; Fischer, O., Glaetzle, W.: "Investigation of the Properties of $PbMo_6S_8$ Powder Processed Wires", in IEEE Transactions on Magnetics, Vol. MAG-19, No. 1, 1983, pp 402–405, in particular page 402 and page 405, left column).

Therefore, the problem the present invention addresses is the manufacture of industrially processible, superconducting wires with the application of superconductive metal-molybdenum chalcogenides (Chevrel phases), with which the drawbacks of the known designs do not appear. Said problem involves the following: During the manufacture of the wire material, the Chevrel phase has to be protected against contamination and interdiffusion of elements which destroy the Chevrel phase. Furthermore, by the selected manufacturing process the Chevrel phase has to be compressed with a density sufficient to achieve a permanent adjustment or setting of the theoretically achievable critical superconductor values. In addition, said manufacturing process to be selected has to supply the structure or pattern of the magnetic flux desired by the expert, and assure the mechanical strength sufficient for further processing to superconducting cables and coils.

SUMMARY OF THE INVENTION

According to the invention, a process is provided wherein a unit having a Chevrel phase is extruded in a first process step at temperatures between 1000° C. and 1600° C. and reduced in cross section in excess of 1:10, subsequently the unit is shaped further in several process steps by additional extruding and/or hot drawing, and the powdery Chevrel phase is reduced to an average grain size of less than 1 um is used.

According to a preferred embodiment of the invention, the initial components for forming a superconducting phase, namely $Mo_2S_3$ or $Mo_2$, Mo and PbS, are loaded in a molybdenum jacket or shell at a stoichiometric ratio of about $PbMo_6S_8$. The transformation into the Chevrel phase takes place in the course of the wire manufacture by hot shaping.

According to another preferred embodiment of the invention, a superconducting phase not in stoichiometric proportion is used, preferably at a ratio of about $PbMo_{6.35}S_8$.

According to yet another preferred embodiment gallium sulfide is added to the Chevrel phase, preferably at a phase ratio of about $PbGa_{0.25}Mo_6S_8$.

According to another preferred way of carrying out the process for producing superconducting wire, a multi-core conductor is produced by loading the superconducting phase or the initial components for forming such phase in a block of molybdenum to form a jacket, said molybdenum block have a plurality of cylinder shaped recesses.

Finally, a preferred process is characterized by the following process features: The powdery superconducting phase, prior to being loaded in the molybdenum jacket, is shaped in the desired geometric form by cold isostatic pressing and selectively by subsequent mechanical after-working.

DETAILED DESCRIPTION OF THE INVENTION

The process of the invention permits the manufacture of superconducting wires having a Chevrel phase that can be technically processed further, for example to manufacture superconductive coils, with the wires exhibiting the critical superconducting properties expected to be exhibited theoretically, but which heretofore were only achieved on the laboratory scale. As opposed to the processing of superconductors of type II, where single-core or multi-core superconductive wires that are satisfactory for technical applications can be produced by many different methods and the wires are advantageously processed to multi-filament conductor by means of the extrusion technology, it was found in the case of the present invention that the manufacture of a superconducting wire with Chevrel phases capable of further industrial processing is made possible only by extruding the Chevrel phases under the conditions specified by the present invention. Only the extrusion within the specified temperature range of 1000° and 1600° C. with the specified reduction in cross section, produces or generates the order of shaping forces that permit compression of the Chevrel phase to superconductors with satisfactory critical current densities. The specified limit values of the extrusion temperature take into account the fact that no adequate force of compression is applied at temperatures below 1000° C., and that the Chevrel phase decomposes at temperatures above 1600° C. If the Chevrel phase is loaded in a molybdenum jacket or shell and subsequently also in a steel jacket, the upper temperature limit of processibility is about 0° C. because of the properties of the steel.

The molybdenum shell or jacket or the molybdenum+the steel jacket enclosing the Chevrel phase serve the purpose of protecting against contamination and the purpose of serving as a barrier against diffusion. In addition, the jacket serves as a shell which, following cooling after the hot shaping step, shrinks on the superconducting core, which assures that the superconducting material will permanently retain or maintain the compression ratio it was provided in the course of the extrusion step.

No adequate compression ratio for producing a stable and durable superconducting phase can be achieved solely by drawing the unit comprised of superconductive Chevrel phase and a molybdenum jacket or molybdenum+steel shell.

If both a first jacket of molybdenum and a second jacket of steel are used, the molybdenum shell primarily serves as a diffusion barrier mainly against iron and other metals contained in the steel, because such metals destroy Chevrel phases even if present only in minuscule amounts.

In addition to molybdenum, earlier publications mentioned mainly tantalum, silver, copper and aluminum as equivalent metals for the diffusion barrier for protecting the Chevrel phase. However, now it has been found that other metals either do not permit the high shaping temperatures required in the extrusion step or exhibit intolerable reactions with the Chevrel phases and/or fail to exhibit the mechanical strength which the sheathing material is required to have.

The superconducting phase sealed in the Molybdenum shell may have, in addition to zones with Chevrel phase, zones with other elements and compounds.

The process of the invention is described in greater detail with the help of an example:

The powdery initial components for forming the Chevrel phases are obtained by reacting the high purity initial elements, for example $Mo + 2S = MoS_2$. The initial components for the super-conducting phase are combined with a non-stoichiometric ratio and with an addition of gallium sulfide to obtain a mixture having the composition $PbGa_{0.25}Mo_6S_8$. It is known that by forming a Chevrel phase with non-stoichiometric ratios and especially by adding gallium sulfide, it is possible to significantly increase the current bearing capacity or critical current density of the superconductor.

In a next process step, the mixture is ground to produce a powder with an average grain size of less than 1 um. The powder mixture so obtained is pressed cold isostatically in a pressing hose to produce rods with a diameter of 60 mm. If need be, the pressed rod may be turned so that it can be fitted as exactly as possible in a cylindrical molybdenum shell with a wall thickness of a few millimeters. The bolt in the shell is degassed under vacuum and subsequently welded in the shell under gas underpressure. The unit so obtained in loaded in a steel jacket and welded in said jacket with underpressure.

The unit so obtained is then extruded in a first shaping step. In said step, the rod is extruded at a temperature of 1300° C. to form a blank with a diameter of 18 mm. The unit or blank is then processed further by hammer forging at about 1000° C. as well as by a great number of drawing operations until finally a wire with a diameter of 0.15 nm is produced.

The reaction of the initial components to the Chevrel phase takes place in the Mo-shell in the course of the wire manufacture under the known transformation conditions.

Wires manufactured as specified above were measrired under superconducting conditions. Said measurements supplied values for the critical superconductive quantities that are comparable to those measured until now on type II superconductors, or surpassing those of type II superconductors in individual quantities. The same applies to wires that were bent or mechanically stressed under conditions analogous to those in coil winding.

What is claimed is:

1. A process for producing a superconducting wire having a metal molybdenum chalcogenide superconductive phase comprising: introducing a powdered superconductive phase or initial components for forming such superconductive phase of a grain size of less than 1 um into a vacuum tight molybdenum shell, extruding said unit at temperatures between about 1000° and 1600° C.; reducing the cross sectional dimension of said unit to less than one-tenth its original size, and subjecting said unit to additional extruding and/or hot drawing.

2. The process for producing a superconducting wire as defined in claim 1, wherein said initial components comprise: (1) $Mo_2S_3$ or $MoS_2$, (2) Mo and (3) PbS and wherein said molybdenum shell at a stoichiometric ratio of about $PbMo_6S_8$.

3. The process for producing superconducting wire as defined in claim 1, wherein the initial components for forming said superconductingg phase are in the non stoichiometric ratio of about $PbMo_{6.35}S_8$.

4. The process for producing a superconducting wire as defined in claim 1, wherein gallium sulfide is added to the initial components in a ratio of about $PbGa_{0.2-5}Mo_6S_8$.

5. The process for producing a superconducting wire as defined in claim 1, wherein a multi core conductor is manufactured by loading the initial components into a molybdenum block having a plurality of cylinder shaped recesses.

6. The process for producing a superconducting wire as defined in claim 1, wherein the initial components are shaped by cold isostatic pressing and/or mechanical after working prior to loading into said molybdenum shell.

7. A process according to claim 1 wherein the metal molybdenum chalcogenide is $PbMo_6S_8$.

8. A process for producing a superconducting wire having a metal molybdenum chalcoenide superconductive phase comprising: introducing a powdered superconductive phase or initial components for forming such superconductive phase of a grain size of less than 1 um into a vacuum-tight molybdenum shell, loading such shell into a steel jacket to form a unit, extruding said unit at temperatures between about 1000° and 1600° C.; reducing the cross sectional dimension of said unit to less than one tenth its original size, and subjecting said unit to additional extruding and/or hot drawing.

* * * * *

UNITED STATES PATENT AND TRADEMARK OFFICE
CERTIFICATE OF CORRECTION

PATENT NO. : 4,704,249

DATED : November 3, 1987

INVENTOR(S) : WOLFGANG GLATZLE

It is certified that error appears in the above-identified patent and that said Letters Patent is hereby corrected as shown below:

IN THE SPECIFICATION:

Column 3, line 15, "$Mo_2$," should read --$MoS_2$,--.

Column 3, line 67, "adeguate" should read --adequate--.

Column 4, line 4, "0°" should read --1300°--.

Column 5, line 2, "0.15nm" should read --0.15mm--.

Column 5, line 8, "measr!red" should read --measured--.

IN THE CLAIMS:

Column 5, (Claim 2) Line 31, after "wherein" insert --such initial components are loaded into--.

Column 6, (Claim 3) Line 1, after "producing" insert --a--.

Column 6, (Claim 3) Line 3, "superconductingg" should read --superconducting--.

UNITED STATES PATENT AND TRADEMARK OFFICE
CERTIFICATE OF CORRECTION

PATENT NO. : 4,704,249

DATED : November 3, 1987

INVENTOR(S) : WOLFGANG GLATZLE

It is certified that error appears in the above-identified patent and that said Letters Patent is hereby corrected as shown below:

Column 6, (Claim 8) Line 22 "chalcoenide" should read --chalcogenide--.

Signed and Sealed this

Fifteenth Day of November, 1988

Attest:

DONALD J. QUIGG

Attesting Officer

Commissioner of Patents and Trademarks